United States Patent

Pattanaik

[11] Patent Number: 5,828,031
[45] Date of Patent: Oct. 27, 1998

[54] HEAD TRANSDUCER TO SUSPENSION LEAD TERMINATION BY SOLDER BALL PLACE/REFLOW

[75] Inventor: Surya Pattanaik, San Jose, Calif.

[73] Assignee: International Business Machines Corporation, Armonk, N.Y.

[21] Appl. No.: 670,551

[22] Filed: Jun. 27, 1996

[51] Int. Cl.$^6$ ................................................. B23K 26/00
[52] U.S. Cl. ................................ 219/121.63; 360/103
[58] Field of Search ................... 219/121.63, 121.64, 219/121.85; 360/103, 104; 427/328; 257/745; 361/707, 794; 228/180.21, 248.1, 180.22; 438/108

[56] References Cited

U.S. PATENT DOCUMENTS

| | | | |
|---|---|---|---|
| 3,719,981 | 3/1973 | Steitz | 29/423 |
| 4,154,877 | 5/1979 | Vratny | 427/328 |
| 4,268,849 | 5/1981 | Gray et al. | 257/745 |
| 4,761,699 | 8/1988 | Ainslie et al. | 360/103 |
| 4,814,855 | 3/1989 | Hodgson et al. | 174/52.4 |
| 5,006,917 | 4/1991 | Kang et al. | 357/70 |
| 5,120,418 | 6/1992 | Kang et al. | 204/224 |
| 5,135,155 | 8/1992 | Kang et al. | 228/179 |
| 5,148,261 | 9/1992 | Kang et al. | 357/67 |
| 5,193,738 | 3/1993 | Hayes | 219/121.85 |
| 5,219,117 | 6/1993 | Lin | 228/253 |
| 5,285,352 | 2/1994 | Pastore et al. | 361/707 |
| 5,316,205 | 5/1994 | Melton | 228/180.21 |
| 5,324,569 | 6/1994 | Nagesh et al. | 428/198 |
| 5,337,219 | 8/1994 | Carr et al. | 361/794 |
| 5,409,157 | 4/1995 | Nagesh et al. | 228/180.22 |
| 5,471,368 | 11/1995 | Downie et al. | 361/760 |
| 5,504,035 | 4/1996 | Rostoker et al. | 437/182 |
| 5,504,277 | 4/1996 | Danner | 174/261 |
| 5,506,385 | 4/1996 | Murakami et al. | 219/121.63 |
| 5,530,604 | 6/1996 | Pattanaik | 360/104 |
| 5,586,715 | 12/1996 | Schwiebert et al. | 228/248.1 |
| 5,604,831 | 2/1997 | Dittman et al. | 219/121.63 |
| 5,646,068 | 7/1997 | Wilson et al. | 437/183 |

FOREIGN PATENT DOCUMENTS

| | | |
|---|---|---|
| 6-23530 | 1/1994 | Japan . |
| 7-37890 | 2/1995 | Japan . |
| 7-170059 | 4/1995 | Japan . |
| 2292826 | 6/1996 | United Kingdom . |
| WO 95/00279 | 5/1995 | WIPO . |

*Primary Examiner*—Geoffrey S. Evans
*Attorney, Agent, or Firm*—Hopkins & Carley; Donald J. Pagel

[57] ABSTRACT

A method for forming electrical solder connections between a thin film magnetic head transducer and the conductors in an integrated suspension after the head has been mechanically attached to a suspension. A solder ball is placed between the head and conductor termination pads. A focused laser beam is used to produce solder reflow. The resulting solder connection has a very fine grain structure and includes a pair of extremely thin layers of intermetallic compounds in the regions where the solder connection abuts the head and conductor termination pads. The solder connection has excellent mechanical properties and reliability. The method avoids the creation of solder bumps during the wafer stage, and therefore the component processing cost is low, and the process is both fast and manufacturable.

15 Claims, 4 Drawing Sheets

HEAD TRANSDUCER TO SUSPENSION LEAD TERMINATION BY SOLDER BALL PLACE/REFLOW

BACKGROUND OF THE INVENTION

1. Field of the Invention

This invention relates to head gimbal assemblies in magnetic recording devices, and more particularly to a method for forming an electrical connection between a thin film magnetic head transducer and conductors in an integrated suspension.

2. Background Art

In a conventional head gimbal assembly, a thin film magnetic head (the "slider") is mechanically attached to a suspension flexure by epoxy bonding. An electrical connection between a thin film magnetic head transducer and read/write electronics is made by twisted pairs of wires which run the length of the suspension. One end of these wires is ultrasonically bonded to gold plated transducer termination pads on the slider.

In a new generation of suspension fabricated by etching a copper alloy/polyimide/stainless steel laminate, the twisted pairs of wires have been replaced by a copper alloy lead structure (see, for example, U.S. Pat. No. 4,996,623, and published UK Patent Application No. GB 2292826 A). Suspensions where the elecrical conductors that convey information to and from the magnetic head are incorporated into a layer of the suspension, are hence forth referred to as 'integrated suspensions.' Representative methods have been described for producing head gimbal assemblies using integrated suspensions, for example in U.S. Pat. No. 4,761,699 and in IBM Technical Disclosure Bulletin, Vol. 36, No. 2, February 1993.

The method of electrical interconnection between the thin film magnetic head transducer and the copper alloy lead structure described in the above cited prior art is by soldering. A solder joint is established between a reflowed solder bump on the termination pad of the slider, the solder being applied at the wafer level, and the copper alloy conductor termination pads or solder bumps on such termination pads.

Several problems are encountered in the slider fabrication process due to the presence of solder bumps on the slider termination pads. In U.S. Pat. No. 5,530,604, the use of a large flattened solder bump which extends up to a flex surface of the slider, reduces some of the problems. However, the disclosed slider fabrication process involves several heat bond/debond processes of the wafer and rows, dry etching processes like reactive ion etching ("RIE"), blasting with abrasive slurry for photoresist and adhesive removal. The heat bond/debond processes tend to oxidize the solder bump and the abrasive blast processes cause erosion of the solder bump, making the bumps less conducive to reflow and thus failure to form a good joint to the suspension leads.

SUMMARY OF THE INVENTION

The current invention provides an improved method of electrical termination between the head transducer and the conductors on an integrated suspension. In one specific embodiment, the invention defines a method for forming an electrical connection between a thin film magnetic head transducer and a metal alloy conductor of an integrated suspension, such as a copper alloy cable. Termination pads employ a solder wettable metallurgy, and the magnetic head is attached to the suspension so that corresponding termination pads of the head and the conductors are in close proximity. A solder ball is placed between the corresponding pads and then reflowed using a focused laser beam.

In a preferred embodiment, a commercially available device is used to place the solder balls and to provide the laser reflow. The commercial device dispenses a discrete solder ball through a capillary onto the pads. The solder ball is held on the pads partially by the tip of the capillary and by the pressure applied by flowing nitrogen gas through the capillary. The positioning of the capillary is controlled by computer and a focused laser beam uses the axial opening of the capillary for reflowing the placed solder ball in situ.

The method has several advantages over the existing art, including: a solder joint similar to one described in the U.S. Pat. No. 5,530,604, is formed without prior solder application on the slider or the conductor lead pads; the solder is applied at the time of assembly and therefore the component processing cost is low; and the process is fast and manufacturable.

BRIEF DESCRIPTION OF THE DRAWING

For a further understanding of the objects, features and advantages of the present invention, reference should be had to the following description of the preferred embodiment, taken in conjunction with the accompanying drawing, in which like parts are given like reference numerals and wherein.

DETAILED DESCRIPTION OF THE INVENTION

Figure 1:
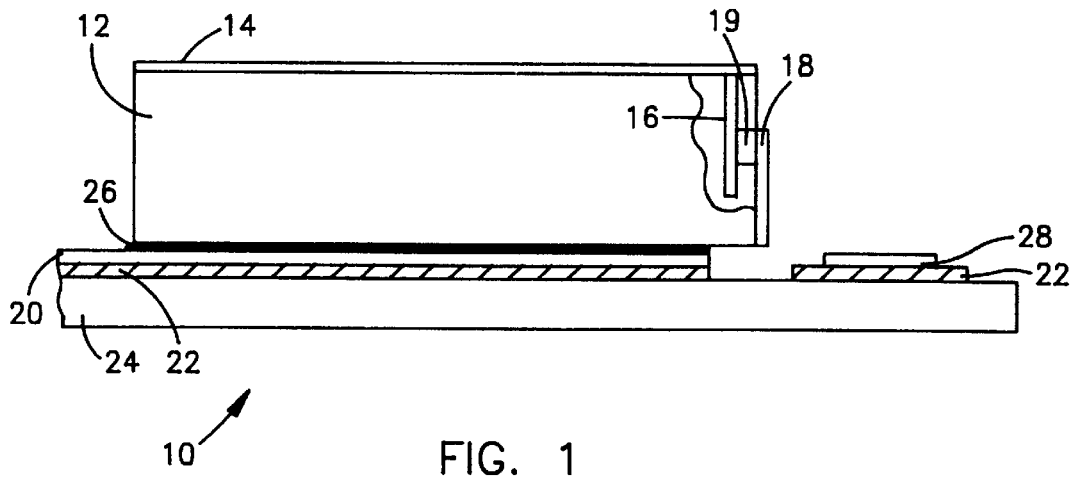
FIG. 1 is a schematic diagram of a head gimbal assembly used in the present invention, before forming an electrical connection.

FIG. 1 is a schematic diagram of a head gimbal assembly (HGA) used in this invention. The gimbal assembly is designated generally by the numeral 10 and includes a slider 12 having an ABS 14, a thin film head structure 16 having a plurality of gold plated copper termination pads 18 (only one is illustrated in FIG. 1), and an electrical connector 19. A typical integrated suspension includes three layers, a metal alloy conductor layer 20, a dielectric layer 22 (e.g. a polyimide), and a support layer 24 (e.g. stainless steel). The slider 12 is bonded to the suspension by an adhesive layer 26, such as an epoxy.

A conductor lead pad 28 is positioned so that the lead pad 28 is aligned to and is in the proximity of the head transducer termination pad 18. The lead pad 28 is formed in the conductor layer 20, which is typically a copper alloy such as a copper-nickel-silicon magnesium alloy; a beryllium-copper alloy; a copper-iron-phosphorous-zinc alloy; a copper-titanium alloy; or any other suitable metal or metal alloy conductor. The lead pad 28 is just the region at the end of one of the conductors formed in the conductor layer 20 (for example, an end of one of the conductors 86 shown in FIG. 7). Typically, there are four of the lead pads 28, but other numbers are possible. Also, to preserve solderability, the lead pads 28 (and usually the whole conductor) are plated with a metal such as gold. Hence, typical lead pads 28 would be gold plated copper alloy.

Figure 8:
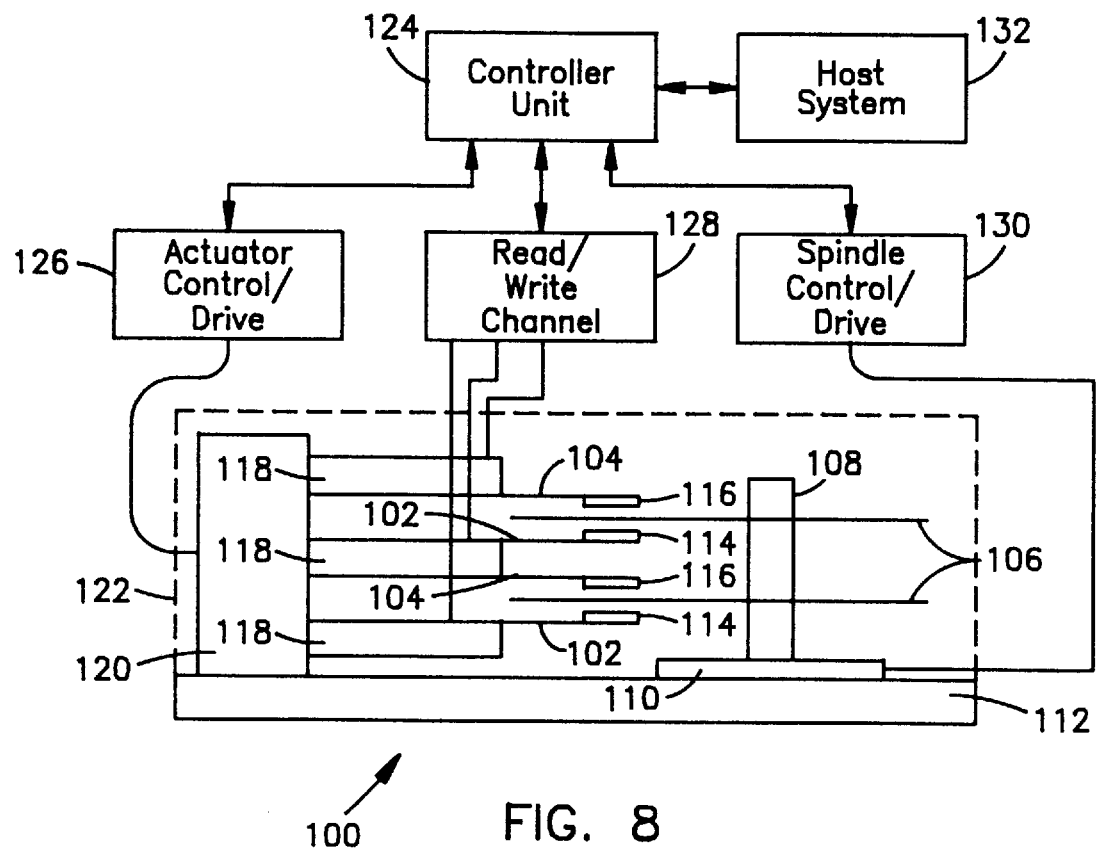
FIG. 8 is a schematic diagram illustrating a magnetic recording disk file using head suspension assemblies including solder connections produced by the method of the present invention.

The present invention relates to methods for joining the termination pads 18 with corresponding lead pads 28 to complete an electrical connection between the head transducer 16 and the read/write electronics of the disk drive (shown in FIG. 8).

Figure 2:
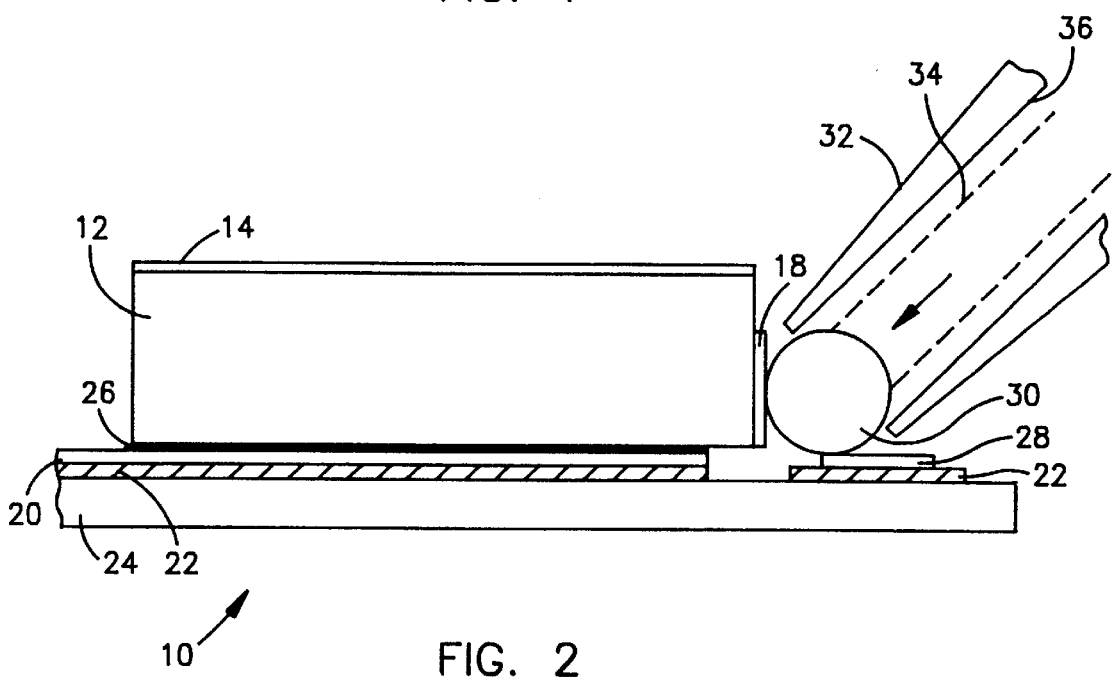
FIG. 2 is a schematic diagram of the head gimbal assembly shown in FIG. 1 illustrating a preferred method of solder ball placement.

FIG. 2 is a schematic diagram which illustrates a preferred method for making the electrical connection. The structure of the HGA is identical to that shown in FIG. 1. FIG. 2 also illustrates a solder ball 30, a capillary 32, and a focused laser beam 34 (broken lines).

The solder ball 30 is placed at the junction of the two corresponding termination pads 18 and 28 by a device commercially available from the Fraunhofer Institute for Reliability and Microintegration, of Berlin, Germany. The principles of operation of the Fraunhofer device are disclosed in a published International Patent Application, No. PCT/DE94/00678, Publication No. WO 95/00279. In practice, the capillary 32 is positioned perpendicular to the ground and the slider 12 is positioned at a forty-five degree angle to the capillary 32 to facilitate placement of the solder ball 30.

The device has a reservoir of solder balls of controlled diameter and dispenses one ball at a time onto a predetermined termination pad through the capillary 32. The solder ball 30 is very lightly held on the pad 28 by the capillary 32 and a flowing nitrogen gas. The solder ball 30 is reflowed in situ by the focused laser beam 34 through an axial opening 36 of the capillary 32. The Fraunhofer device is intended for solder ball bumping on wafers for flip chip attachment in the electronics industry.

In a preferred embodiment, the focused laser beam is supplied by an Nd:YAG laser, however, other lasers are also suitable to create the desired solder connection.

Figure 3:
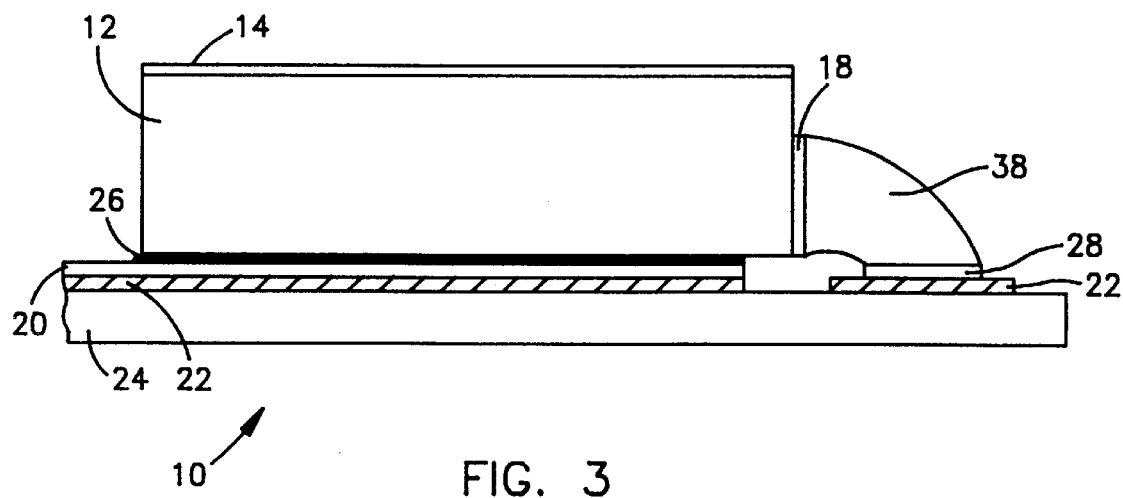
FIG. 3 is a schematic diagram of the head gimbal assembly after laser reflow of the solder balls shown in FIG. 2.

FIG. 3 is a schematic diagram which illustrates an electrical connection formed between the corresponding termination pads 18, 28 by the preferred method of the present invention. The basic structure is identical to that shown in FIGS. 1 and 2, and uses the same identification numbers.

On reflow, the solder ball 30 melts, flows and wets the corresponding termination pads 18 and 28, forming a right angled solder fillet 38, illustrated in FIG. 3. Such electrical connections have proven to be extremely strong and reliable.

The termination pad metallurgy for these methods is not limited to copper with immersion gold. Any solder wettable metallurgy including a plated gold or nickel/gold finish can be used. The solder ball of preference is made from a 63%Sn–37%Pb alloy and balls of various sizes are commercially available. However, solder balls made from different solder alloys, such as 58%Bi–42%Sn, can also be used.

Most common soldering alloys contain tin as a constituent and the most common base metal to be soldered is copper or copper alloy with or without a gold finish. During conventional soldering operations (e.g., infrared or convective furnace reflow, hot gas reflow, etc.) the molten solder interacts with the base metal and/or the finish to form what is known as intermetallic compounds ("IMC"). IMC can be copper-tin, copper-gold or combinations. IMC forms a distinct layer between the base metal (copper) and solder.

Figure 4:
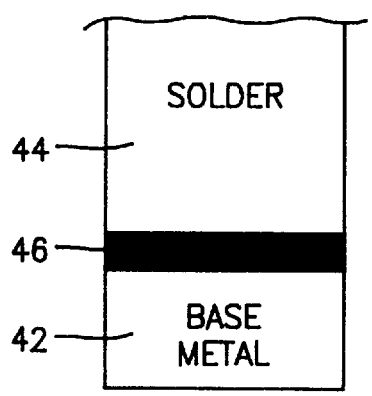
FIG. 4 is a pictorial diagram illustrating microscopic details of a solder connection formed by conventional methods and having a thick intermetallic compound layer.

Such a layer is shown in FIG. 4, a pictorial diagram which illustrates microscopic details of a typical IMC layer. The solder connection is designated generally by the numeral 40, and includes a base metal region 42, a solder region 44, and an intermetallic compounds region 46.

The thickness of an IMC layer is controlled by reflow temperature and time. In conventional reflow processes (e.g. infrared or convective furnace reflow, hot gas reflow, etc.), the time the solder stays molten can be from a few seconds to a few minutes. As a result, an IMC layer 46 of several microns is formed. Moreover, due to a slower solidification process following reflow, the grain size of the solder 44 is fairly large, of the order of several microns (5–10 typically) due to diffusional processes aiding in grain growth.

Figure 5:
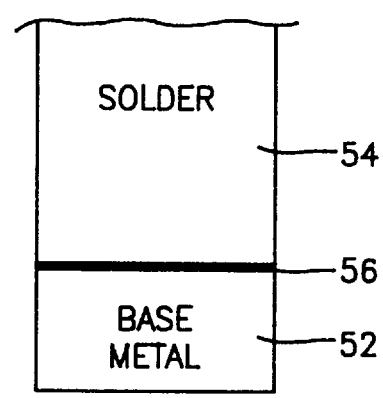
FIG. 5 is a pictorial diagram illustrating microscopic details of a solder connection according to one aspect of the present invention and having an extremely thin intermetallic compound layer.

Laser beam reflow, such as used in several embodiments of the present invention, involves extremely rapid heating and cooling. By using a laser beam 34 (FIG. 2) to melt the solder ball 30, the solder remains molten only for a very small fraction of a second. The reflow times are in the range of 1–50 milliseconds. FIG. 5 is a pictorial diagram which illustrates microscopic detail of an IMC layer resulting from laser beam reflow. The solder connection is designated generally by the numeral 50, and includes a base metal region 52, a solder region 54, and a very thin intermetallic compounds region 56. The solder joint 50 has two unique features which distinguish it from a solder joint formed by conventional reflow: (1) the IMC layer 56 is extremely thin, less than 1 micron, and (2) the solder 54 has an extremely fine grain structure, in the range of 0.1–2 micron in size. These features provide excellent mechanical properties and reliability to the solder joint 50 and can be easily identified by cross-sectioning of the joint.

Figure 6:
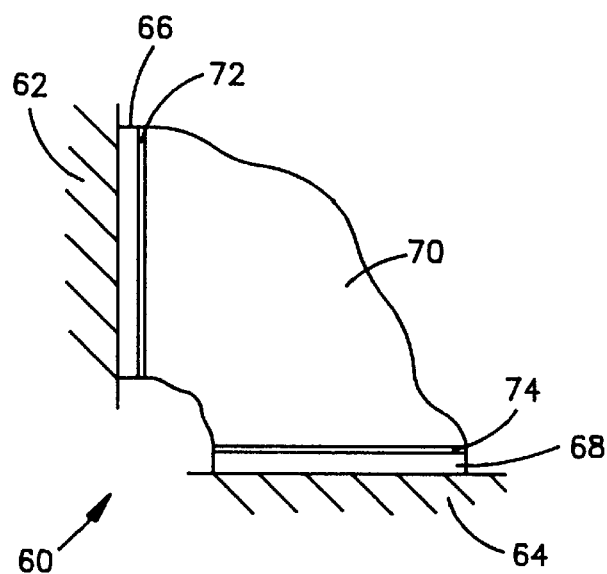
FIG. 6 is a partial schematic diagram illustrating a solder connection according to the present invention and having a pair of extremely thin intermetallic compound layers.

FIG. 6 is a partial schematic diagram illustrating the solder joint of FIG. 3, formed according to one aspect of the present invention, and designated generally by the numeral 60. The joint illustrated in FIG. 6 includes a portion of a slider 62, a portion of a suspension dielectric 64, a slider termination pad 66, a corresponding suspension termination pad 68, laser reflowed solder 70 joining the corresponding termination pads, and a pair of extremely thin IMC layers 72 and 74. Solder joints produced according to the present invention include the extremely thin IMC layers 72 and 74, whereas solder joints produced by conventional reflow methods exhibit much thicker IMC layers (e.g., layer 46 of FIG. 4).

Figure 7:
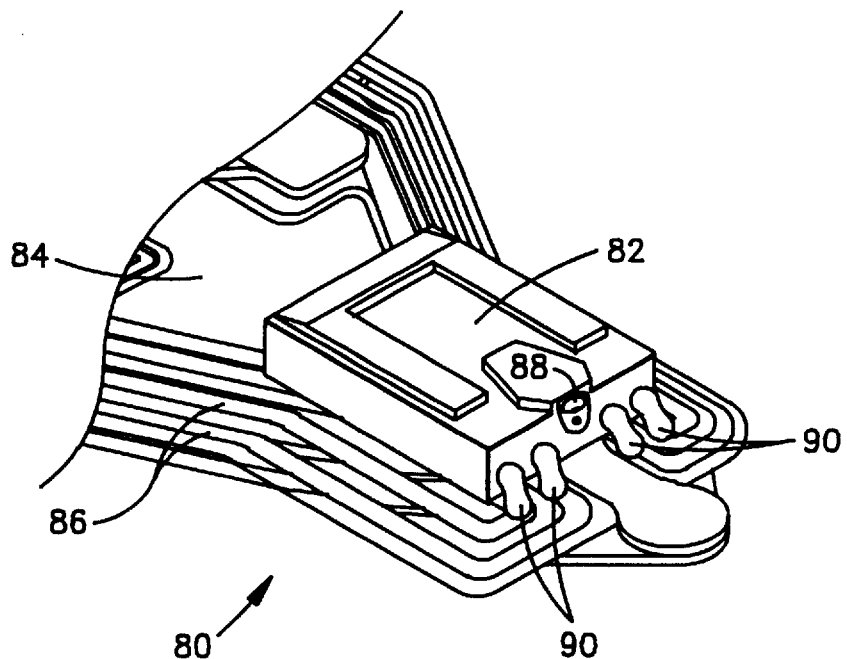
FIG. 7 is a partial pictorial diagram illustrating a portion of a head suspension assembly including a solder connection produced by the method of the present invention.

FIG. 7 is a partial pictorial diagram which illustrates a portion of a magnetic head suspension assembly according to another aspect of the present invention, designated generally by the numeral 80. The partial assembly 80 includes a slider 82, a suspension 84, copper alloy conductors 86, a magnetic head transducer 88, and a plurality of solder connections 90 which are identical to the fillet 38 shown in FIG. 3.

FIG. 8 is a schematic diagram of a magnetic recording disk file 100 that utilizes a head suspension assembly 102 such as the assembly 80. It should be appreciated that the suspension system 104 is identical to the suspension system 102 so that the following comments apply equally to either the suspension system 102 or the suspension system 104. It should also be appreciated that the suspension systems 102 and 104 could be used with other data storage systems, such as floppy disk drives, optical drives or compact disk players.

The disk file 100 includes a plurality of magnetic recording disks 106 suitable for use in hard disk drives. The disks 106 are mounted on a spindle shaft 108 which is connected to a spindle motor 110. Motor 110 is mounted to a chassis 112.

A plurality of read/write sliders 114 and 116 are positioned over the disks 106 such that each disk 106 can be accessed by one of the sliders 114 or 116. The sliders 114 and 116 include solder connections such as the solder connections 90 illustrated in FIG. 7. Each of the sliders 114 and 116 includes a transducer for reading and writing data on a plurality of concentric data tracks on the disks 106, and are attached to one of the suspension systems 102 (or 104). Each of the suspension systems 102 (or 104) are attached to an actuator arm 118 which is attached to a rotary actuator 120. The rotary actuator 120 moves the actuator arm 118 (and hence the suspension system 102 or 104 and the sliders 114 or 116) in a radial direction across the disk 106. An enclosure 122 (shown by a broken line in FIG. 8) seals the disk file 100 and provides protection from particulate contamination.

A controller unit 124 provides overall control to the magnetic recording disk file 100. The controller unit 124 contains a central processing unit (CPU), memory unit and other digital circuitry and is connected to an actuator control/drive unit 126 which in turn is electrically connected to the actuator 120. This allows the controller unit 124 to control the movement of the sliders 114 and 116 over the disks 106. The controller unit 124 is electrically connected to a read/write channel 128 which in turn is electrically connected to the sliders 114 and 116. This allows the controller unit 124 to send and to receive data from the disks 106. The controller unit 124 is electrically connected to a spindle control/drive unit 130 which in turn is electrically connected to the spindle motor 110. This allows the controller unit 124 to control the rotation of the disks 106. A host system 132, which is typically a computer system, is electrically connected to the controller unit 124. The host system 132 may send digital data to the controller unit 124 to be stored on the disks 106, or may request that digital data be read from the disks 106 and sent to the host system 132. The basic operation and structure of data storage systems, such as the disk file 100 (without the suspension systems 102 or 104), are well-known in the art.

It should be noted that the laser beam reflow process described with respect to FIG. 2, can also be used to form connections between other electrical components. For example, the process can be used to connect termination pads for the conductors 86 located at the opposite end of the suspension 84 from the slider 82 (see FIG. 7), with the termination pads for the circuitry in the read/write channel 128 (shown in FIG. 8).

While the foregoing detailed description has described a method for forming an electrical connection between a termination pad on a thin film magnetic recording head and a conductor, and a head gimbal assembly having a connection formed by the method, and a magnetic recording disk file using such suspensions, it is to be understood that the above description is illustrative only and should not be considered limiting of the disclosed invention. The invention is to be limited only by the claims as set forth below.

What is claimed is:

1. A method for forming an electrical connection between a magnetic head transducer and an electrical conductor comprising:

using a capillary tube to place a solder ball in contact with a head termination pad and a conductor termination pad, the capillary tube including an axial passage which extends along a length of the capillary tube, and the head termination pad being part of a transducer for reading and writing data on a magnetic disk; and irradiating the solder ball with a focused laser beam from a laser to cause reflow of the solder ball, the focused laser beam being directed to the solder ball through the axial passage.

2. The method as set forth in claim 1, wherein the laser is operated for an interval between 1 and 50 milliseconds to obtain the necessary solder reflow.

3. The method as set forth in claim 2, wherein the laser is operated for an interval between 2 and 3 milliseconds to obtain the necessary solder reflow.

4. The method as set forth in claim 1, wherein the laser is operated to deliver a predetermined quantum of energy.

5. The method as set forth in claim 1, wherein the focused laser beam is provided by an Nd:YAG laser.

6. The method as set forth in claim 1, wherein the solder ball is made from a 63%Sn–37%Pb alloy.

7. The method as set forth in claim 1, wherein the solder ball is made from a 58%Bi–42%Sn alloy.

8. The method as set forth in claim 1, wherein the head termination pad comprises a metal plated with gold.

9. The method as set forth in claim 1, wherein the head termination pad comprises copper plated with gold.

10. The method as set forth in claim 1, wherein the head termination pad comprises nickel plated with gold.

11. A solder joint defining an electrical connection between a head termination pad on a thin film magnetic head transducer and a conductor termination pad of a conductor in close proximity, the solder joint being produced by using a capillary to place a solder ball between the head termination pad and the conductor termination pad, and reflowing the solder ball using a focused laser beam, the solder joint having a thin layer of intermetallic compounds between the conductor termination pad and the reflowed solder, the thin layer of intermetallic compounds having a thickness of less than approximately one micron.

12. The solder joint as set forth in claim 11, having a fine grain structure in the range of 0.1 to 2 micron.

13. The solder joint as set forth in claim 11, wherein the solder joint is formed of a reflowed 58%Bi–42%Sn solder alloy.

14. The solder joint as set forth in claim 11, wherein the solder joint is formed of a reflowed 63%Sn–37%Pb solder alloy.

15. A method for forming an electrical connection between the read/write electronic circuitry of a disk drive and an electrical conductor comprising:

using a capillary tube to place a solder ball in contact with a read/write circuit termination pad and a conductor termination pad, the capillary tube including an axial passage which extends along a length of the capillary tube, and the read/write circuit termination pad being part of the electronics for the circuitry in a read/write channel of a disk drive; and irradiating the solder ball with a focused laser beam to cause reflow of the solder ball; the focused laser beam being directed to the solder ball through the axial passage.

* * * * *